(12) United States Patent
Weidlich

(10) Patent No.: US 11,063,200 B2
(45) Date of Patent: Jul. 13, 2021

(54) DEVICE FOR GUIDING CHARGE CARRIERS AND USE THEREOF

(71) Applicant: Helmut Weidlich, Unkel (DE)

(72) Inventor: Helmut Weidlich, Unkel (DE)

( * ) Notice: Subject to any disclaimer, the term of this patent is extended or adjusted under 35 U.S.C. 154(b) by 473 days.

(21) Appl. No.: 15/542,616

(22) PCT Filed: Jan. 11, 2016

(86) PCT No.: PCT/EP2016/025000
§ 371 (c)(1),
(2) Date: Jul. 10, 2017

(87) PCT Pub. No.: WO2016/113141
PCT Pub. Date: Jul. 21, 2016

(65) Prior Publication Data
US 2018/0269373 A1 Sep. 20, 2018

(30) Foreign Application Priority Data

Jan. 12, 2015 (DE) .................. 15000040.4

(51) Int. Cl.
| | |
|---|---|
| *H01L 39/14* | (2006.01) |
| *G01R 33/06* | (2006.01) |
| *G21K 1/093* | (2006.01) |
| *H01L 29/06* | (2006.01) |
| *H01L 29/205* | (2006.01) |
| *H01L 29/82* | (2006.01) |
| *H01L 43/00* | (2006.01) |

(Continued)

(52) U.S. Cl.
CPC .......... *H01L 39/143* (2013.01); *G01R 33/06* (2013.01); *G21K 1/093* (2013.01); *H01L 29/0657* (2013.01); *H01L 29/205* (2013.01); *H01L 29/82* (2013.01); *H01L 43/00* (2013.01); *H01L 43/10* (2013.01); *H02N 11/002* (2013.01)

(58) Field of Classification Search
None
See application file for complete search history.

(56) References Cited

U.S. PATENT DOCUMENTS

2006/0289984 A1* 12/2006 Fontana, Jr. ............ H01L 43/12
257/692
2009/0152606 A1 6/2009 Koo et al.
(Continued)

FOREIGN PATENT DOCUMENTS

DE 3903919 A1 8/1990

OTHER PUBLICATIONS

Chuan-Kui Wang, "Quantum bound states in a ballistic quantum channel with a multiple double-bend discontinuity Quantum bound states in a ballistic quantum channel with a multiple double-bend discontinuity", Semicond. Sci. Technol., Jan. 1, 1995, pp. 1131-1138. (Year: 1995).*

(Continued)

*Primary Examiner* — Steven B Gauthier
(74) *Attorney, Agent, or Firm* — Andrus Intellectual Property Law, LLP

(57) ABSTRACT

A device for guiding charge carriers and uses of the device are proposed, wherein the charge carriers are guided by means of a magnetic field along a curved or angled main path in a two-dimensional electron gas or in a thin superconducting layer, so that a different presence density is produced at electrical connections.

12 Claims, 9 Drawing Sheets

(51) Int. Cl.
*H02N 11/00* (2006.01)
*H01L 43/10* (2006.01)

(56) References Cited

U.S. PATENT DOCUMENTS

2010/0165518 A1* 7/2010 Boone, Jr. ............ G11B 5/3993
360/324
2020/0350492 A1* 11/2020 Weidlich ............... H01L 37/025

OTHER PUBLICATIONS

Wang, Chuan-Kui et al.; "Quantum bound states in a double-bend quantum channel"; Journal of Applied Physics; Mar. 15, 1995; pp. 2564-2571; vol. 77, No. 6.
Nii, Masahiro et al.; "Three-dimensional model for numerical electromagnetic field analyses of coated superconductors and its application to Roebel cables"; Superconductor Science and Technology; Jul. 6, 2012; vol. 25, No. 9; Great Britain.
International Search Report and Written Opinion for International Application No. PCT/EP2016/025000 dated May 2, 2016. (Previously Submitted).

* cited by examiner

DEVICE FOR GUIDING CHARGE CARRIERS AND USE THEREOF

FIELD

The present invention relates to a device for guiding carriers, each of which has an electrical charge and/or a magnetic moment, particularly charge carriers, especially preferably electrons, as well as to uses of the device.

BACKGROUND

For the vast majority of all objects in the real world in which groups or ensembles of particles (e.g., gas molecules in a volume, electrons in a solid, etc.) are moving, these particles are subject to the so-called ergodic theorem. This means that, theoretically, when observed for a sufficient length of time, every possible point in the phase space (of spatial and momentum coordinates) of this system will be reached with the same frequency. The laws of thermodynamics, particularly the first and second laws, apply to such systems.

Non-ergodic systems have mostly only been known in theory. For example, a pool table with ideally parallel walls and a frictionlessly rolling ball represents such a non-ergodic system if the ball is tossed from the center of the table exactly perpendicularly to one of the bordering walls and reflected off the bordering walls ideally perpendicularly to the wall. In this case, the ball would always roll back and forth only on the connecting line between the two ideally parallel walls but never reach the other areas of the pool table.

In the cited example, the conditions for the occurrence of the non-ergodic system are considerable, to wit: the shape of the bordering walls must be ideally parallel, the shape of the path of the particle (ball) must be ideally straight, the reflection off the walls must be ideally perpendicular, the initial direction of motion must be ideally perpendicular to the wall, and there must be no variation on the path without contact with bordering walls. Such conditions can rarely be achieved in practice.

The present invention deals with such non-ergodic systems, with possible implementations and applications being indicated.

DE 39 03 919 A1 discloses a device and a method for guiding electrons in a solid, wherein a thin semiconductor layer is applied to a spherically curved surface of an electrical insulator. By means of a magnetic field, the radius of curvature of the path of the electrons in the layer is brought to the same or similar order of magnitude as the radius of curvature of the layer. A difference in potential is tapped between two spaced-apart points on the curved layer. The dimensions, particularly the thickness of the semiconductor layer, must lie in the order of magnitude of the mean free path length of the electrons in the semiconductor layer, which are very small in a homogeneous semiconductor layer, which renders implementation difficult.

The articles "Quantum bound states in a ballistic quantum channel with a multiple double-bend discontinuity" by Chuan-Kui Wang. Semicond. Sci. Technol., 1 Jan. 1995, pages 1131-1138, and "Quantum bound states in a double-bend quantum channel" by Chuan-Kui Wang et al., Journal of Applied Physics, Vol. 77, no. 6, 1 Jan. 1995, pages 2564-2571, deal with quantum states of an electron gas in a narrow channel with oppositely double-curved discontinuity without the influence of an external field and without an examination of direction-dependent conductivities. Moreover, the channel width must lie substantially below the de Broglie wavelength of the electrons in order to achieve the desired quantum-mechanical behavior.

It is the object of the present invention to provide a device for guiding carriers, each of which has an electrical charge and/or a magnetic moment, particularly charge carriers, especially preferably electrons, as well as uses of such devices, with a simple construction and simple manufacture being enabled and various possible applications being indicated.

The aforementioned object is achieved by a device according to the present disclosure or through use of a device as presently disclosed. Advantageous developments constitute the subject matter of the subclaims.

SUMMARY

According to a first aspect of the present invention, the device preferably has a guide device which has or forms a two-dimensional electron gas or a thin, superconducting layer for the formation of a movement region for the mobile carriers. To wit, relatively large mean free path lengths are present in these two-dimensional electron gases or superconducting layers, particularly for electrons. This enables the desired movement region to be achieved in a very simple manner. The width of the movement region and its radius of curvature are, particularly, on the order of magnitude of the mean free path length but still above the de Broglie wavelength of the carriers or electrons in the movement region. This sizing is especially advantageous for producing the desired non-ergodic system for the carriers.

The carriers move in the guide device and in the movement region at a mean speed that is also dependent on the thermal energy.

The movement region forms or delimits a curved or angled main path for the carriers. Using a field-generating means, a field—particularly magnetic field—for guiding the carriers at least substantially along the main path can be generated. Accordingly, the carriers are able to move at least substantially freely, i.e., virtually avoiding or minimizing impacts, in a direction that is at least substantially along the main path or parallel thereto. In the opposite direction, however, the carriers are deflected particularly in the direction of lateral flanks of the movement region. Consequently, there are a substantially greater number of impacts and reflections at boundary surfaces in the opposite direction. Also, in particular, due to the occurrence of wall impacts that are at least partially not strictly reflective or are particularly diffusely scattering, this leads to a nonuniform distribution of the carriers and hence results in a different probability of presence or probability density/presence density of the carriers in the area of the start and end of the main path or along the main path. In particular, according to the proposal, a different conductivity is produced depending on the direction, with the conductivity along the main path being preferably greater than the conductivity in the opposite direction.

The main path is particularly at least substantially a main direction of extension of the movement region and/or a path of motion that is followed in the ideal case by a carrier in a direction in the movement region in consideration of the acting field neglecting impacts. The main path therefore lies particularly on the main plane of the movement region and within the movement region, preferably at least substantially along a bent (deflected) center line of the movement region.

Each of the carriers preferably carries an electrical charge, particularly electrons or, alternatively, so-called holes or electron holes. Thus, an electrical voltage, an electric current, and/or an electric power can be tapped, based on the different probability of presence or probability density/presence density of the carriers, by means of electrical connections arranged appropriately along the main path. This has been confirmed by experiments.

In principle, it is also possible for the carriers to each have a magnetic moment and interact with an electrical and/or magnetic field.

According to another aspect of the present invention that can also be implemented independently, the guide device and/or the movement region preferably extends at least substantially along a closed, flat, or spherical surface or on a plane and is curved or angled in this surface or plane. This makes it possible in a relatively simple manner, particularly by means of planar layers, to construct and manufacture a proposed device, even with very small dimensions, preferably with a mean radius of curvature of the main path of less than 2000 nm and/or with a mean width of the guide device or movement region of less than 2000 nm.

According to another, independent aspect of the present invention, the proposed device can be used to generate an electrical voltage, particularly direct-current voltage, and power from the thermal or heat energy of charge carriers and/or from the electromagnetic inherent or ambient noise and/or from electromagnetic influence or radiation by tapping the voltage or power via the connections.

Preferably, the field or magnetic field for guiding the charge carriers is held at least substantially constant. Alternatively or in addition, a control or regulation of the field or magnetic field can be done such that the tapped voltage or electrical power is held at a target value or maximum value.

Another aspect of the present invention is that the proposed device can be used for cooling through the removal of thermal energy from charge carriers by tapping electrical power via the connections. This is very easy to implement and can, in principle, be used for a wide variety of purposes.

Here, preferably, the field or magnetic field for guiding the charge carriers is held at least substantially constant. Alternatively or in addition, a control or regulation of the field or magnetic field can be done such that the tapped electrical voltage or power is held at a target value or maximum value.

According to another aspect of the present invention, the proposed device can also be used to measure or detect electromagnetic inherent or ambient noise of charge carriers or of electromagnetic radiation by measuring an electrical voltage via the connections. Through the measurement of the voltage, the noise or the electromagnetic radiation can then be detected or determined.

In particular, the field or magnetic field or the acting magnetic field strength is held at least substantially constant during the abovementioned measurement. With proper calibration, it is then possible to very easily detect or determine the noise or an acting electromagnetic radiation. In principle, however, the field or magnetic field for guiding the carriers can also be varied.

According to another aspect of the present invention, the proposed device can also be used to measure or determine scattering or trajectories of charge carriers by measuring an electrical voltage via the connections. In particular, the measured voltage can provide information on conditions of the guide device or in the movement space.

In general, the proposed device can be used to measure or determine physical characteristics within a one- or two-dimensional electron gas or superconductor.

When measuring or determining scattering, trajectory, and/or (other) physical characteristics, the field or magnetic field guiding the charge carriers can be held at least substantially constant and/or varied over space and/or time as needed. With proper calibration, the desired measurements or determinations can be very easily performed in consideration of the measured voltages.

Moreover, it is possible to use the device without field-generating means to measure magnetic field strengths acting on the guide device by measuring the electrical voltage via the connections. Particularly if calibration is performed beforehand, a measurement of magnetic field strengths is possible.

Individual aspects and features of the present invention cited above and following below can be combined with one another as desired or also implemented independently of one another.

Other aspects, features, advantages, and characteristics of the present invention follow from the claims and the following description of preferred embodiments with reference to the drawing.

BRIEF DESCRIPTION OF THE DRAWINGS

In the figures, same or similar components and devices are designated by the same reference symbols, with the same or analogous advantages and characteristics being achieved even if a repeated description is omitted.

DETAILED DISCLOSURE

Figure 1:
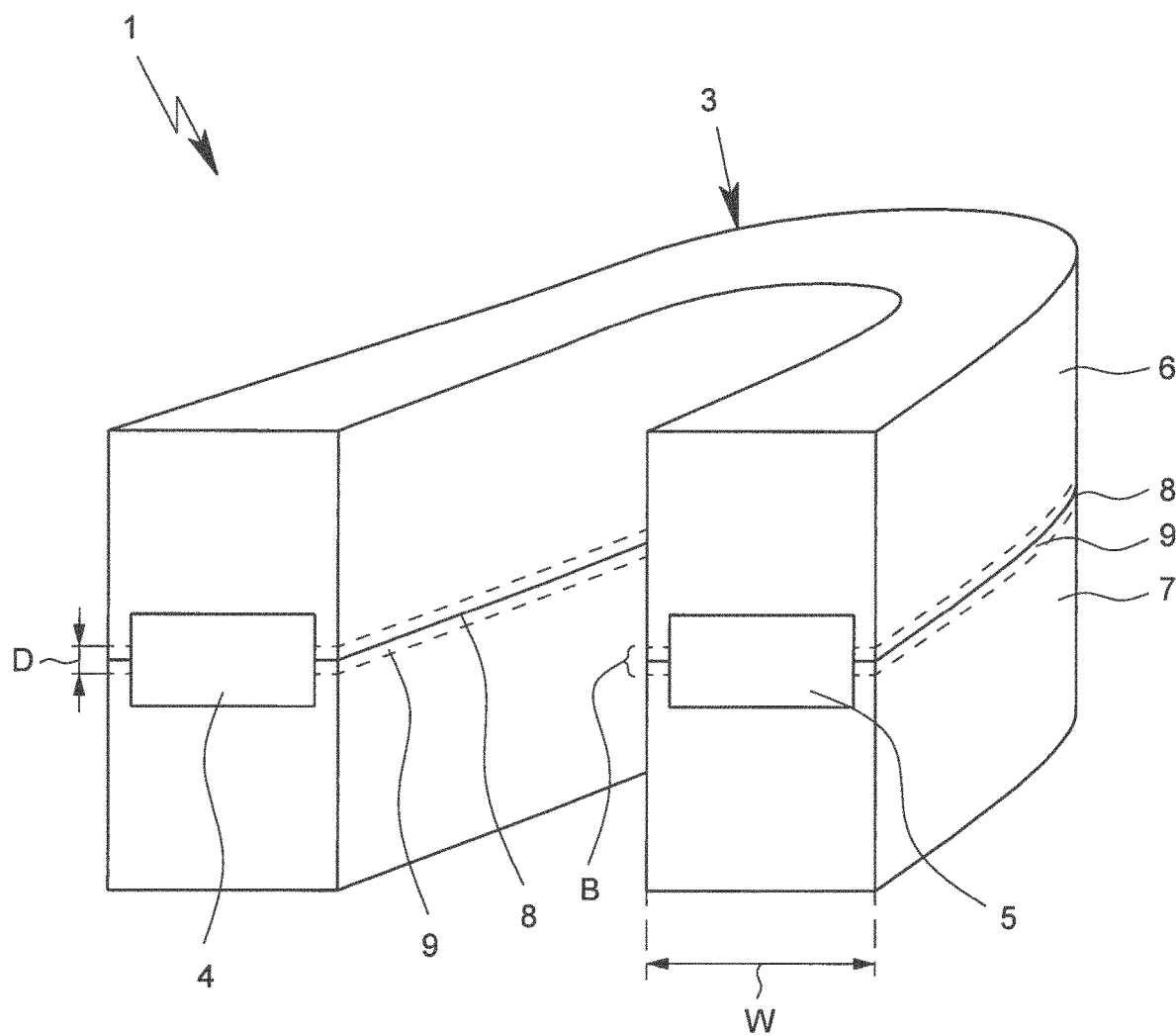
FIG. 1 shows a perspective view of a proposed device, but without field-generating means, according to a first embodiment.
Figure 2:
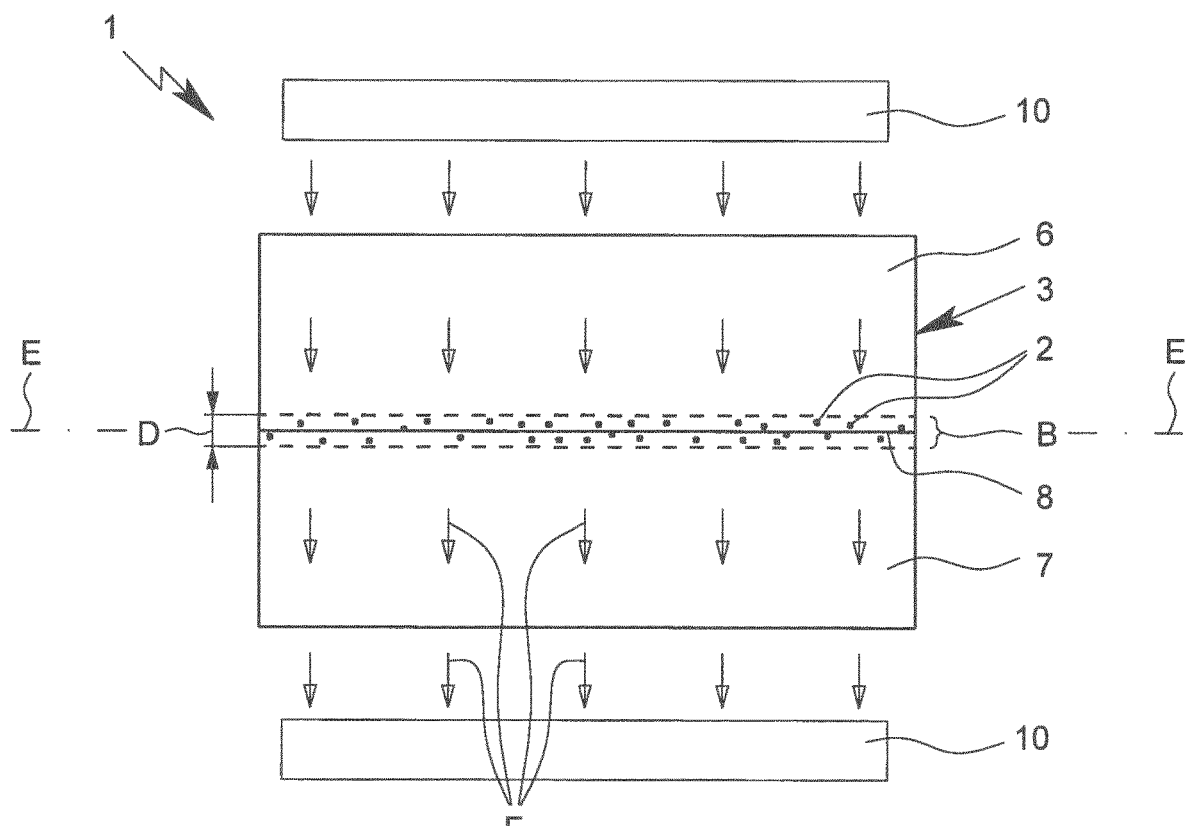
FIG. 2 shows a schematic side view of the device with field-generating means.
Figure 3:
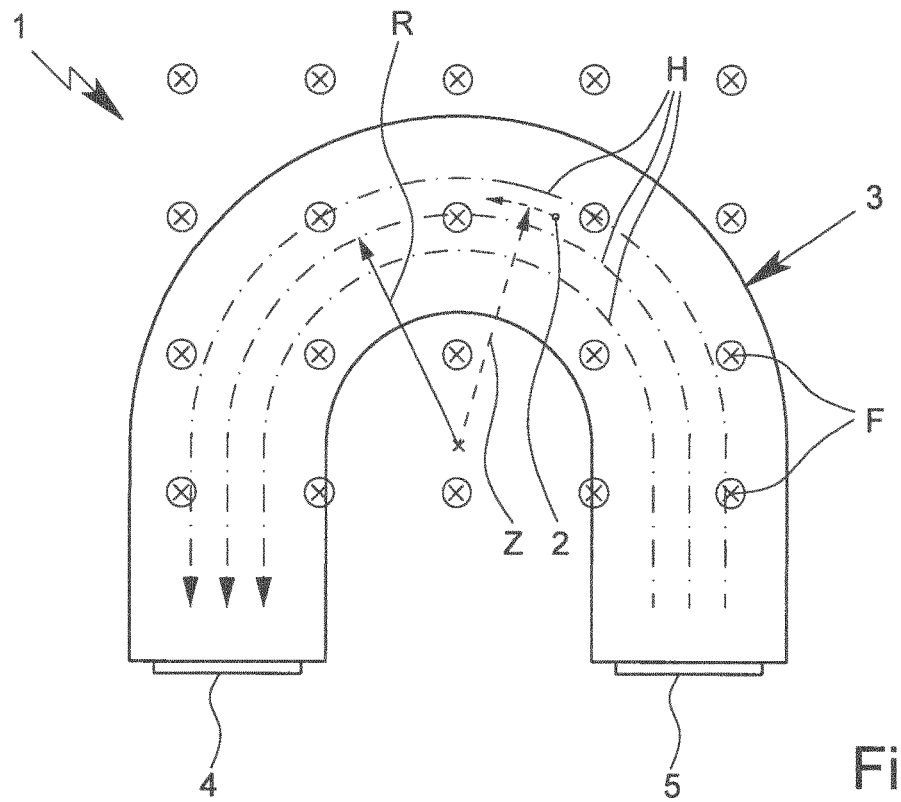
FIG. 3 shows a schematic top view of the device without field-generating means.

In a highly schematic, perspective view. FIG. 1 shows a proposed device 1 according to a first embodiment. FIG. 2 shows the device 1 in a schematic side view with associated field-generating means 10. FIG. 3 shows the device 1 in a schematic top view without the field-generating means 10.

The device 1 is used to guide carriers 2 (indicated schematically in FIG. 2), each of which has an electrical charge and/or a magnetic moment. The carriers 2 are particularly charge carriers, especially preferably electrons. However, they can also be so-called holes, i.e., electron holes.

The device 1 has a guide device 3 for movably guiding the carriers 2. The guide device 3 is particularly a solid body or solid structure. The carriers 2 can thus move particularly in a solid body or solid structure.

Preferably, the carriers 2 can move at least substantially only in one-particularly flat and/or laminar—movement region B, as indicated in FIG. 2.

The device 1 or guide device 3 is preferably provided with electrical connections 4 and 5, which are indicated in FIGS. 1 and 3.

In the depicted example, the device 1 or guide device 3 is preferably constructed from a first solid body or semiconductor 6 and a second solid body or semiconductor 7. These are arranged over one another in laminar fashion and/or have a common boundary surface 8.

The contact or boundary surface 8 of the two solid bodies or semiconductors 6, 7 or movement region B is preferably at least substantially flat and/or extends preferably at least substantially along a closed—particularly flat or spherical—surface and/or in a plane E, as indicated in FIG. 2.

The layers or solid bodies 6, 7, lying on top of each other, preferably form a two-dimensional electron gas for the carriers 2. In the terms of solid-state physics, the electron gas consists of freely movable carriers 2 in the form of electrons or holes in the conduction band, particularly with a large mean free path length of preferably greater than 100 nm, particularly greater than 200 nm. This especially conductive zone is preferably formed only on both sides of the boundary surface 8. i.e., in the form of a very thin layer that forms the movement space B for the carriers 2.

As mentioned previously, instead of electrons, these can be, for example, so-called holes i.e., electron holes, that can move as charge carriers at least largely freely and particularly with a large mean free path length in the movement region B.

The guide device 3 and/or the movement region B preferably forms a curved or angled main path H for the carriers 2, with several parallel main paths H being indicated schematically in FIG. 3.

The guide device 3 and/or the movement region B and/or the main path H is preferably curved in an arcuate manner, particularly in semicircular or horseshoe-shaped fashion. Alternatively or in addition, however, the guide device 3 and/or the movement region B and/or the main path H can also be angled a single time or multiple times.

Especially preferably, the guide device 3 and/or the movement region B and/or the main path H extends at least substantially in a surface or plane E very especially preferably here the plane E of the boundary surface 8, and is curved and/or angled in this surface or plane E. This is conducive to very easy execution and manufacture, particularly in terms of the application of very thin layers having a defined thickness.

The connections 4 and 5 are preferably arranged and/or spaced apart from one another along the main path H, particularly in the area of the ends of the arch or angling of the guide device 3 or movement region B.

The movement region B is preferably layer-like and/or multilayered. The movement region B or the respective layer preferably has a mean thickness D of less than 500 nm, particularly less than 300 nm, especially preferably about 200 nm or less.

The mean width W of the movement region B and the radius of curvature R of the main path H corresponds or correspond at least substantially to the mean free path length of the carriers 2 in the movement region B or is or are preferably smaller.

The (mean) radius of curvature R of the guide device 3 and/or of the movement region B and/or main path H is preferably greater than 100 nm, particularly greater than 200 nm, and/or less than 2000 nm, particularly less than 1600 nm.

The mean width W of the movement region B is preferably greater than 80 nm, particularly greater than 100 nm, and/or less than the (mean) radius of curvature R.

The boundary surfaces of the movement region B are preferably embodied such that the carriers 2 are reflected; in principle, this can occur specularly (i.e., the angle of reflection corresponds at least substantially to the angle of incidence) or non-specularly, i.e., in a particularly diffusely scattering manner.

Especially preferably, the carriers 2 are reflected particularly on lateral flanks 9 of the movement region B. This preferably occurs in a diffusely scattering and/or at least partially non-specular manner.

The device 1 preferably has the field-generating means 10. Alternatively, this field-generating means 10 or the field F generated by it can be only associated with the device 1 and/or act only on the device 1 or guide device 3 or movement region B.

The field-generating means 10 is used to generate or control a field F for guiding the carriers 2 at least substantially along the main path H, particularly so that a different probability density/presence density of the carriers 2 is or can be generated at the connections 4 and 5 and/or in the vicinity of the ends of the arcuate or angled main path H.

The field F is indicated schematically in FIGS. 2 and 3.

The field F is particularly a magnetic field. The field-generating means 10 is thus designed particularly to generate a magnetic field. As a matter of principle, permanent magnets can be used for this purpose. Alternatively, however, electromagnets can also be used, particularly in order to generate an electromagnetic field as a field F for guiding the carriers 2.

Preferably, the field-generating means 10 is embodied such that the field F for guiding the carriers 2 acts at least substantially only in the area of the curvature or bending of the movement region B and/or guide device 3 and/or deflects the carriers 2 onto curved paths at least substantially only in that area.

The field F for guiding the carriers 2 and/or the field-generating means 10 is or can be preferably set up or adapted or even controlled or regulated such that the carriers 2, starting from a mean speed—particularly as a function of the mean kinetic energy or thermal energy—are guided through the field F (particularly due to the Lorentz force with a gyroradius Z, as indicated schematically in FIG. 3) at least substantially along the curved or angled main path H and/or at least substantially with the mean radius of curvature R in the guide device 3 or in the movement region B. As mentioned previously, this applies particularly only to a direction of motion along the main path H and not in the opposite direction. This asymmetry is important with respect to the proposed nonuniform distribution of the carriers 2 in the movement region B or along the main path H.

The gyroradius Z effected by the field-generating means 10 and/or by the field F is preferably on the order of magnitude of the (mean) radius of curvature R of the guide device 3 or of the movement region B. Especially preferably, the gyroradius Z is smaller or greater than the radius of curvature R by no more than a factor of 5, especially preferably by no more than a factor of 2. In particular, the gyroradius Z corresponds at least substantially to the radius of curvature R.

Due to the different probabilities of presence of the carriers 2 in the area of the ends of the angled or curved main path H, an electrical voltage, particularly also an electric current and hence also electrical power, can be emitted or tapped via the connections 4 and 5 arranged particularly in these areas.

In the depicted example, the connections 4 and 5 are arranged particularly on the two front sides or ends of the movement region B and/or main path H and/or the guide device 3.

As required, several guide devices 3 or movement regions B can also be arranged with their flat sides on top of one another. These are then preferably penetrated by the same field F. In particular, these can be optionally connected in parallel or serially, particularly to the connections 4 and 5 or other connections.

The proposed device 1 can be used particularly to generate an electrical voltage or power from the thermal or heat energy of charge carriers 2 and/or from the electromagnetic inherent or ambient noise and/or from electromagnetic influence or radiation by tapping the voltage or power via the connections 4 and 5. The field F is preferably maintained at least substantially constant. Alternatively, however, the field F can also be controlled or regulated in order to achieve or exceed a defined value or reach a maximum in the tapped current or power.

Alternatively or in addition, the proposed device 1 can also be used for cooling through the removal of thermal or heat energy from the carriers 2 by tapping electrical power via the connections 4 and 5. It is thus also possible to cool the device 1 itself. This can also be conducive to taking power, which constitutes a self-reinforcing effect.

During cooling, the field F is preferably maintained at least substantially constant. Alternatively, however, the field F can also be controlled or regulated in order to achieve or exceed a defined value or reach a maximum in the tapped voltage or power.

Furthermore, it is possible to use the proposed device 1 for measuring or determining scattering or trajectories of charge carriers 2 by measuring the electrical voltage via the connections 4 and 5. In particular, the acting field F can be varied, thereby inferring corresponding scattering or trajectories of charge carriers 2 by identifying maxima in the measured electrical voltage, for example.

In general, the proposed principle can also be used to measure or determine physical characteristics within a one- or two-dimensional electron gas or superconductor if the movement region B is formed in or by such a one- or two-dimensional electron gas or superconductor. Accordingly, the voltage present at corresponding connections 4 and 5 provides information about the physical characteristics, particularly as a function of the acting field F or magnetic field.

The proposed principle can also be used to measure or identify magnetic field strengths or other fields F acting on the guide device 3 by measuring the electrical voltage via the connections 4 and 5. Namely, this depends on the acting field F, as will be explained in further detail later on in relation to the third embodiment and the related diagram. In particular, with proper calibration, the acting magnetic field strength of the field F can be determined from the measured electrical voltage.

Additional embodiments of the proposed device 1 of the present invention are explained in further detail with reference to the other figures. The preceding remarks, aspects, and features apply particularly in analogous or supplementary fashion even if a repeated description is omitted.

Figure 4:
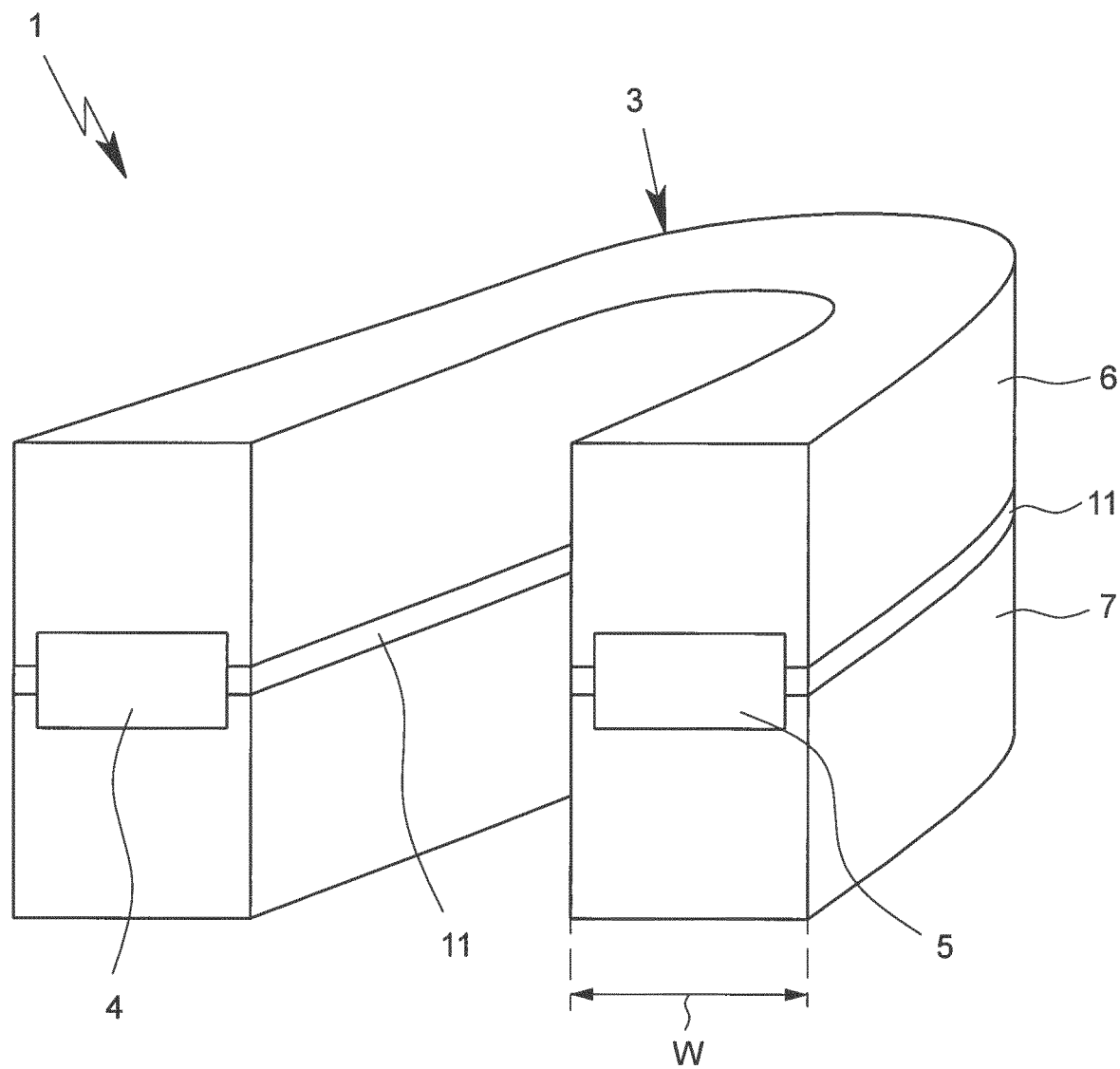
FIG. 4 shows a perspective view of a proposed device according to a second embodiment.

In a schematic view corresponding to FIG. 1, FIG. 4 shows a proposed device 1 according to a second embodiment.

The second embodiment differs from the first embodiment only in that, instead of an electron gas, a thin superconducting layer 11 is preferably used to form the movement region B. The superconducting layer 11 is preferably formed or arranged by or on the solid body 6 or 7 and/or particularly between the two, as is indicated in FIG. 4.

The dimensioning of the layer 11 or of the movement region B formed by it preferably corresponds to the movement region B described in relation to the first embodiment and the dimensioning thereof, so that reference is made thereto.

The carriers 2 are particularly present in the superconducting layer 11 as electrons or holes. i.e., electron holes.

A superconducting material of so-called type II is particularly used for the layer 11, so that, in the case of higher magnetic fields, magnetic field lines in the form of so-called flux lines or vortices penetrate into the material, with so-called hard superconducting materials being preferably used in which the flux lines are held up to a defined threshold force that is as high as possible so that they have a high flux-flow resistance.

Figure 5:
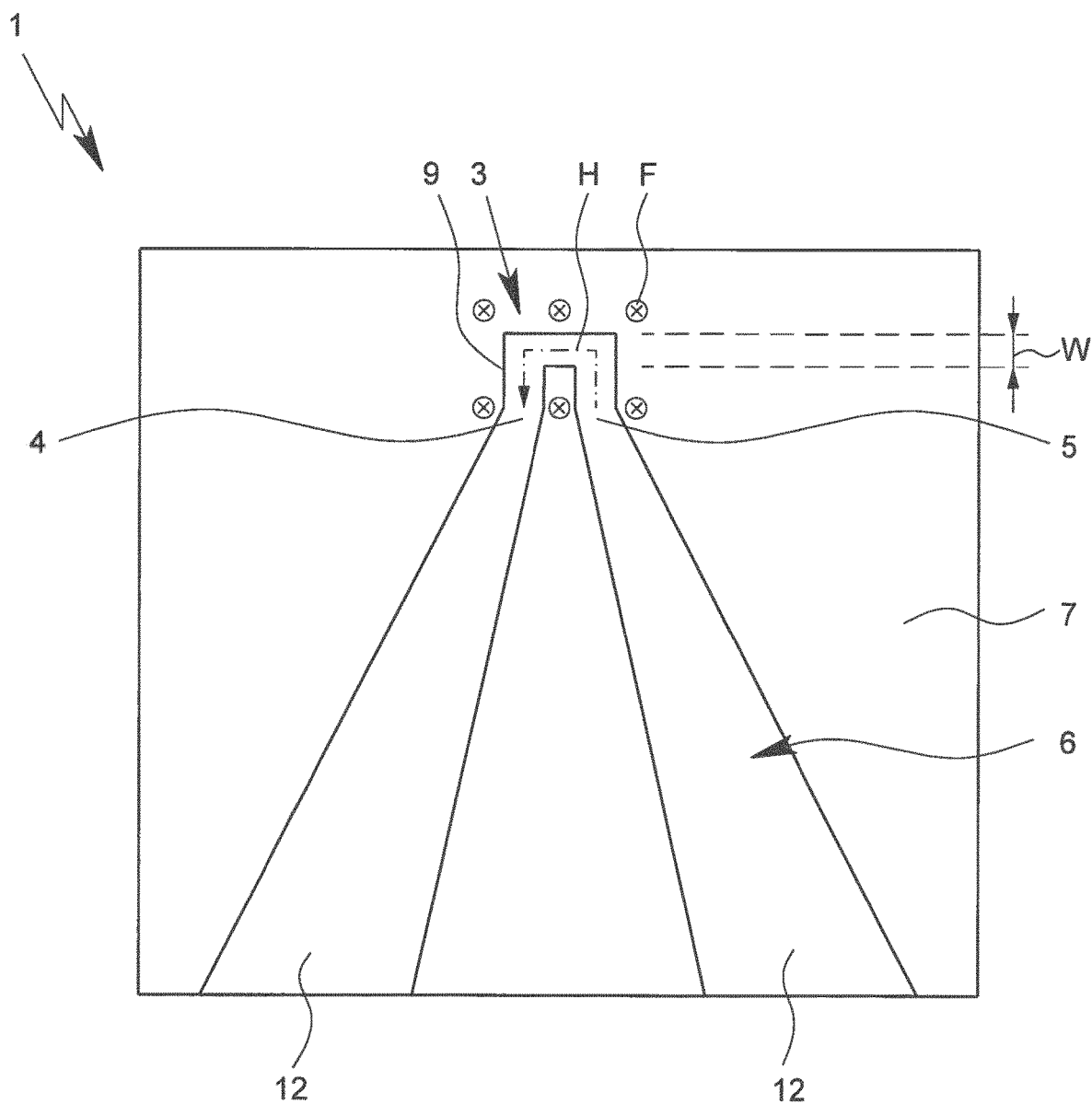
FIG. 5 shows a schematic top view of a proposed device according to a third embodiment.

In a schematic top view, FIG. 5 shows a proposed device 1 according to a third embodiment. This is a schematic representation of an implemented experimental setup.

A layer 6 is applied to a lower layer or a lower substrate or solid body 7 the layer 6 particularly forming a layer system or layer package or is constructed as such.

Especially preferably, the layer 6 or layer system is constructed according to the experimental setup as follows:

A layer of a first semiconductor material, particularly GaAs. and a layer of a second semiconductor material, particularly $Al_{0.33}Ga_{0.67}As$, are layered over one another. In particular, these layers are layered multiply over one another in an alternating manner, preferably more than 10 or 20 times, particularly between 20 and 1 times, and in the experimental setup especially preferably 50 times. A layer package is thus formed.

The thickness D of the individual layers is preferably less than 50 nm, particularly less than 25 nm, especially preferably less than 10 nm, and most preferably about 5 nm.

The layer package is optional and is preferably arranged on a base layer or intermediate layer, particularly of GaAs and/or with a thickness of greater than 100 nm, especially preferably greater than 250 nm, most preferably with a thickness of about 500 nm.

A covering layer or first layer of preferably greater than 500 nm, particularly greater than 750 nm, especially preferably about 1000 nm, and/or preferably of GaAs is preferably applied to the layer package or another substrate.

In turn, another or second layer of $Al_{0.33}Ga_{0.67}As$ with a thickness of about 10 to 50 nm, especially preferably about 35 nm, is preferably applied to this GaAs layer. Preferably, yet another layer or first covering layer, particularly of $Al_{0.33}Ga_{0.67}As$, particularly with silicon doping of preferably $1.5 \cdot 10^{18}$ cm$^{-3}$ and/or with a thickness of preferably greater than 25 nm particularly about 45 nm, is applied over that.

Subsequently, another layer or covering layer can be applied, particularly of GaAs, especially preferably with a thickness of greater than 10 nm, and about 15 nm in the experimental setup.

The two-dimensional electron gas and laminar movement region B is preferably formed in the boundary region between the first layer or 1000 nm layer, here of GaAs, and the second layer or 35 nm layer, here of undoped $Al_{0.33}Ga_{0.67}As$.

The aforementioned layer system is especially preferably applied to the lower layer system or the lower solid body 7. In the experimental setup, this layer or solid body 7 especially preferably consists of a semiconducting GaAs substrate.

That is, the following layer system was especially preferably used in the experimental setup:

| Name/designation | Preferred composition | Preferred thickness |
|---|---|---|
| Additional covering layer | GaAs | 15 nm |
| First covering layer | $Al_{0.33}Ga_{0.67}As$: Si $1.5 \cdot 10^{18}$ cm$^{-3}$ | 45 nm |
| Second layer | $Al_{0.33}Ga_{0.67}As$ | 35 nm |
| First layer | GaAs | 1000 nm |
| Multiply superimposed thin layers | GaAs $Al_{0.33}Ga_{0.67}As$ | 5 nm 5 nm |
| Intermediate layer | GaAs | 500 nm |
| Lower layer/substrate | S—I GaAs | >500 nm |

The layer 6 or layer system thus forms a two-dimensional electron gas and hence a movement region in the abovementioned sense, as described in connection with the first embodiment. Reference is therefore made to the remarks and explanations regarding the first embodiment, which apply analogously or additionally.

In the illustration according to FIG. 5, the surface or plane E of the movement region B or the boundary surface 8 lies within the layer system 6 in the drawing plane or parallel thereto.

In the third embodiment, the guide device 3 and/or layer 6 and/or the layer system preferably form two tapering and/or converging legs 12, which form or lead to the connections 4 and 5.

In particular, the layer 6 or the layer system forms the guide device 3 in the form of a singly or multiply, particularly doubly, angled profile. In particular, a substantially U-shaped profile is formed in the top view or in the plane of the movement region B or for the main path H, as indicated in FIG. 5.

The movement region B or the guide device 3 is particularly limited to the upper U-shaped region of the layer 6 or the region indicated by the main path H in FIG. 5.

The mean width W of the angled or U-shaped profile or of the movement region B is preferably greater than 200 nm, particularly greater than 500 nm, and/or less than 9000 nm, particularly less than 7000 nm.

In the experimental setup, a mean width W of about 600 to 650 nm was obtained. In the experimental setup, the interspace in the region of the two connections 4 and 5 was also preferably as much as the mean width W or less.

The proposed setup or arrangement can be produced in a relatively simple manner particularly by photolithographic means or through appropriate etching or, alternatively, through laser processing or laser ablation.

Preferably, different semiconductor materials are used for the layer system.

In the experimental setup, the abovementioned semiconductor materials in particular were used for the layer system 6 and/or mean free path lengths around 600 nm were achieved.

The field F or magnetic field preferably extends at least substantially perpendicular to the drawing plane or plane E (not drawn in), as indicated in FIG. 5.

Figure 6:
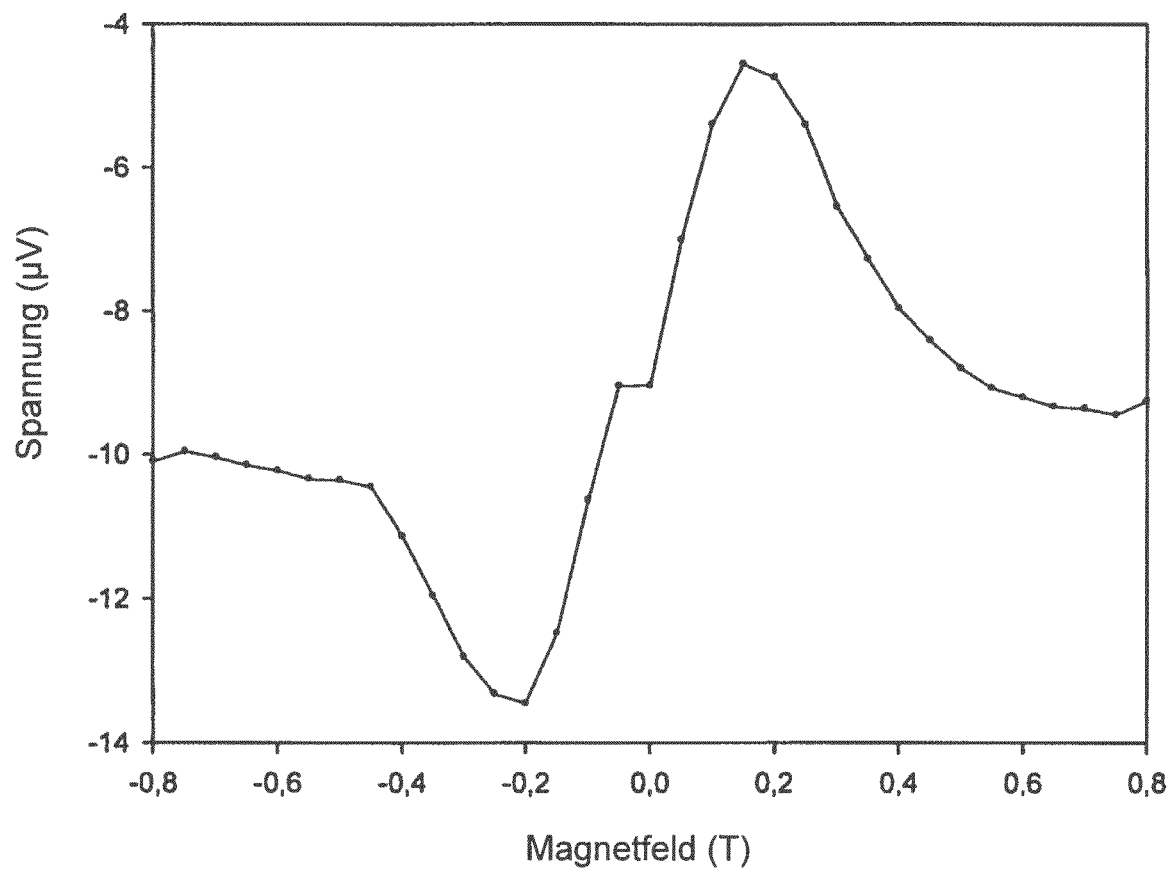
FIG. 6 shows a voltage diagram measured on the device according to the third embodiment.
Figure 7:
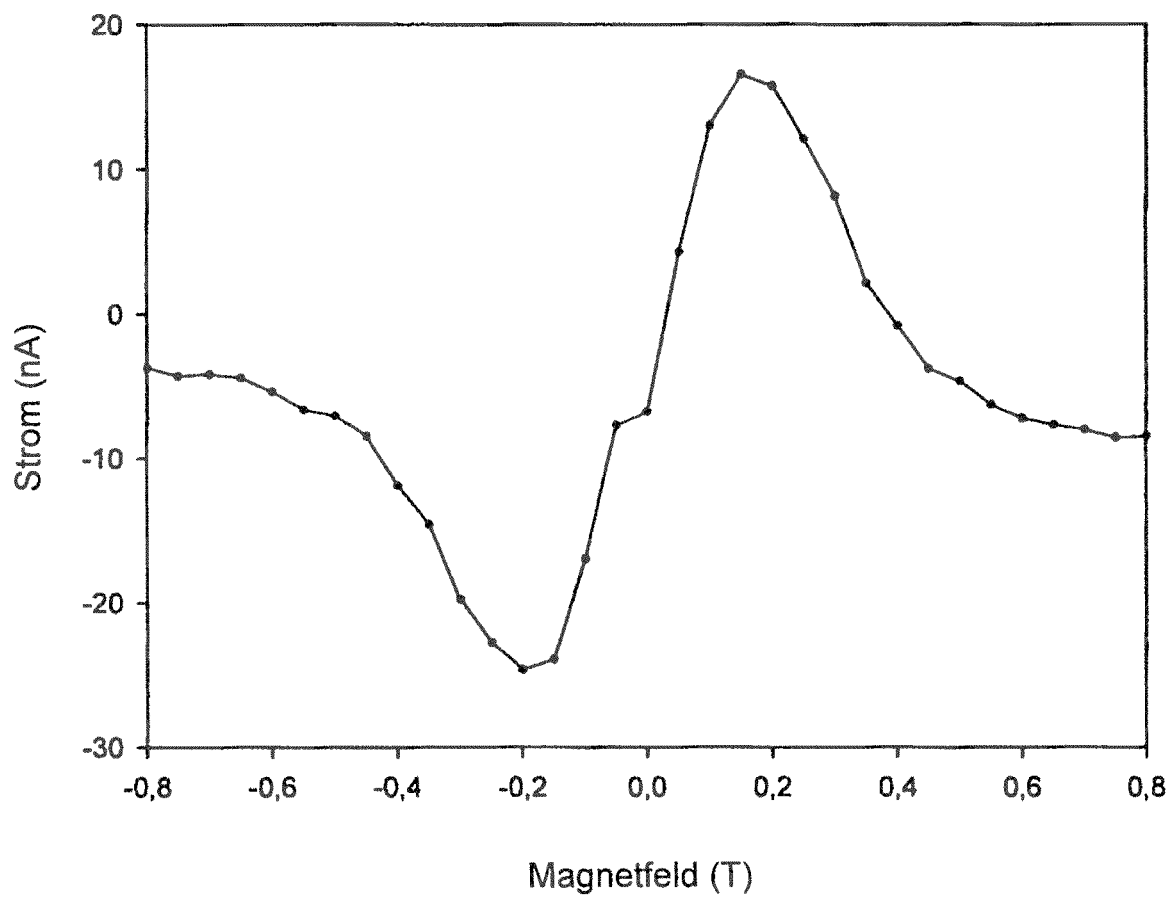
FIG. 7 shows a current diagram measured on the device according to the third embodiment.

In the proposed experimental setup, the voltage on the one hand and the current on the other hand were measured via the legs 12 or connections 4 and 5 as a function of the magnetic field applied or the resulting magnetic flux density. FIGS. 6 and 7 show the resulting diagrams and curves.

It can clearly be seen from FIGS. 6 and 7 that an extreme value, more particularly a minimum and maximum, is obtained for the voltage and current, respectively, at about ±0.2T. This is commensurate with theoretical calculations for the mean radius of curvature R of about 600 nm implemented here. The measurements were performed at temperatures below 20 K.

The resulting diagrams and measurement curves are—as expected—symmetrical to the zero point of the magnetic field (more precisely of the magnetic flux density) and can be explained by the fact that, given the magnetic flux density of about 0.2 T under the stated test conditions, the charge carriers are guided at least substantially along the main path H, that is, within the desired movement region B and/or guide device 3, namely in dependence on the direction of the magnetic field once in one direction and once in the other direction, so that opposite polarities are obtained at about +0.2T and −0.2 T for the voltage and the current, respectively.

Alternatively or in addition, the offset that can be seen as original measurement data in the diagrams according to FIGS. 6 and 7 can be explained by electrostatic or Peltier effect-related interference, which is, however, independent from (invariant to) the magnetic field.

Figure 8:
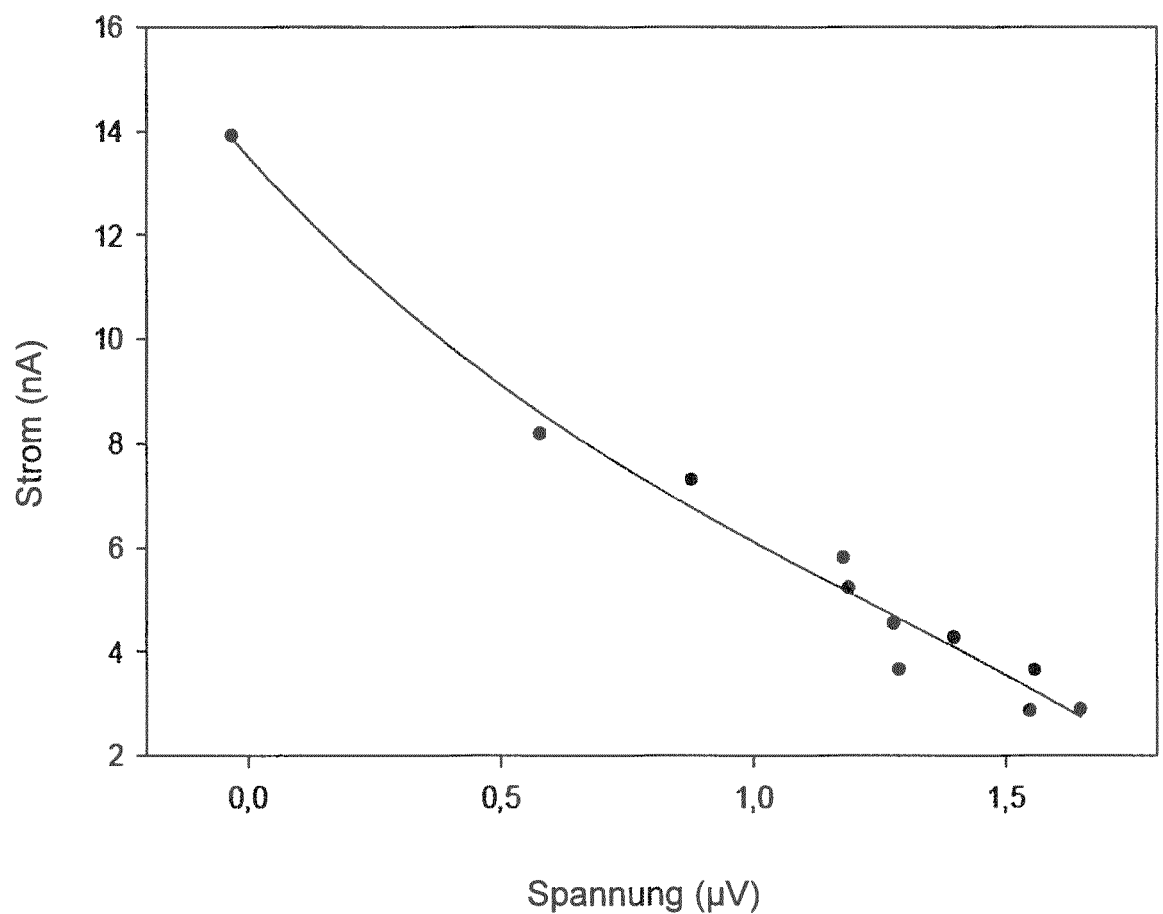
FIG. 8 shows a diagram of a measured current/voltage characteristic, i.e., a diagram of the tappable electrical power.

FIG. 8 shows a current/voltage characteristic measured using the described experimental setup or device 1 tapped externally. This characteristic shows that electrical power can be generated and/or be emitted and/or tapped from the proposed device 1.

Accordingly, an electrical voltage or electrical power can thus be tapped by means of the proposed experimental setup or device 1 and generated or made available from the thermal energy of the charge carriers 2 or the device 1 or the guide device 3 and/or from the electromagnetic inherent or ambient noise or from electromagnetic influence or radiation. In other words, it is thus possible to use the device 1 for the provision of electrical energy or power by means of an electrical tap via the connections 4 and 5.

Alternatively or in addition, it is also possible to use the device t for cooling. To wit, if electrical power is tapped via the connections 4, 5, thermal energy is drawn from the charge carriers 2 or the device 1 or guide device 3, whereby a cooling effect or temperature reduction can be achieved.

Especially preferably, the field-generating means 10 or the field F for guiding the carriers 2 can be controlled or regulated in order to reach or exceed a defined or desired level of tapped electrical voltage or power or in order to reach a maximum of the tapped electrical voltage or power.

As mentioned previously, the proposed device 1 or the proposed principle is universally applicable.

In particular, the voltage tapped via the connections 4, 5 can also be used to measure or determine other characteristics, particularly the measurement or determination of scattering or trajectories of charge carriers 2 with appropriate calibration or appropriate variation of the respective conditions, such as the field F.

Furthermore, it is also possible to measure or determine physical characteristics of the guide device 3 and/or of the movement region B and/or of the carriers 2 movable therein through the measurement and analysis of the electrical voltage tapped via the connections 4, 5. This is especially the case if a one- or two-dimensional electron gas or a superconductor is used as a guide device 3 or for the movement region B or as a (conductive) layer 11.

Moreover, the proposed device 1—without, however, the field-generating means 10—can also be used to measure magnetic field strengths or magnetic flux densities acting on the guide device 3 by measuring the electrical voltage via the connections 4 and 5. Then, with appropriate calibration, the acting magnetic flux density is accordingly very easy to determine and/or identify. The device 1 (without field-generating means 10) can then be regarded and used particularly as a magnetic sensor.

Alternatively or in addition, the proposed device 1 can also be used or employed to detect or measure electromagnetic inherent or ambient noise (of the carriers 2) and/or an electromagnetic influence or radiation.

Figure 9:
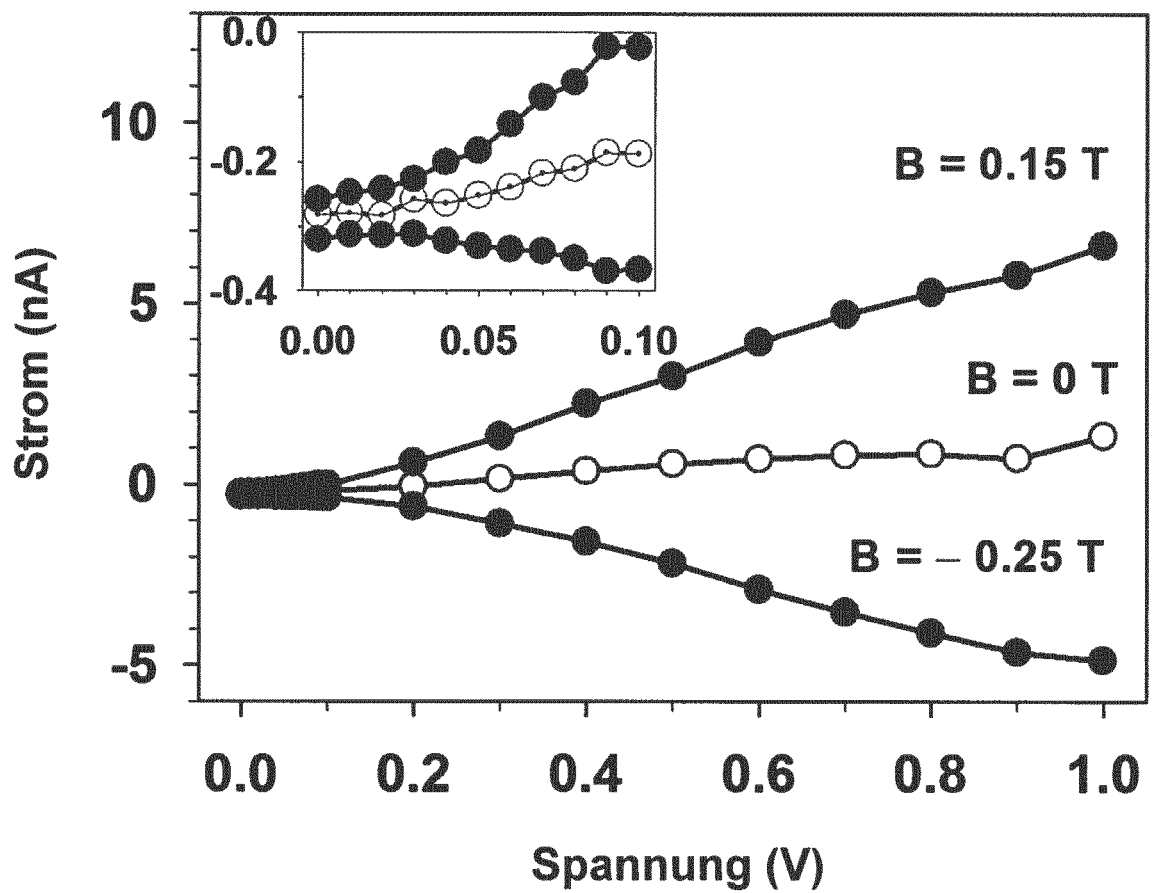
FIG. 9 shows a diagram of various current characteristics.

FIG. 9 shows the result of current measurements that were carried out on an experimental setup in terms of the invention and tapped or measured via the connections 4 and 5. It demonstrates how robust the effect of unequal conductivity is in the two directions that are dependent on the orientation of the magnetic field. In this experiment, an additional alternating current voltage coming from the outside was applied to the setup in order to provide excitation in the MHz range, and this applied voltage was varied over a wide range from 0 to about 1 V.

The measurement was performed at about 10 K.

With a measurement series B=0 T, the neutral curve was defined which shows the current without an external magnetic field but under inclusion of all other possible sources of interference (such as currents as a result of electrochemical contacts or thermoelectric voltages). The measurement series with the magnetic field B=+0.15 T shows that the preference for conductivity in the positive current direction remains positive over all excitation frequencies and the resulting current is approximately proportional to the alternating current voltage applied. The measurement series with the magnetic field B=−0.25 T shows, in addition, that the preference for conductivity in the negative current direction remains negative over all excitation frequencies and the resulting current is also approximately proportional to the alternating current voltage applied. In particular, however, it should be emphasized that even in the complete absence of an external excitation (i.e., where V=0), a positive (B=+0.15 T) or negative (B=−0.25 T) current flows in departure from the case without a magnetic field (see insert or enlargement in FIG. 9). This is proof that continuous electrical output can be tapped externally from the setup or device 1 according to the invention that does not originate from the influence of other possible sources of interference (such as currents resulting from electrochemical contacts or thermoelectric voltages), but rather only from the thermal energy of the electrons or the inherent or ambient noise.

Figure 10:
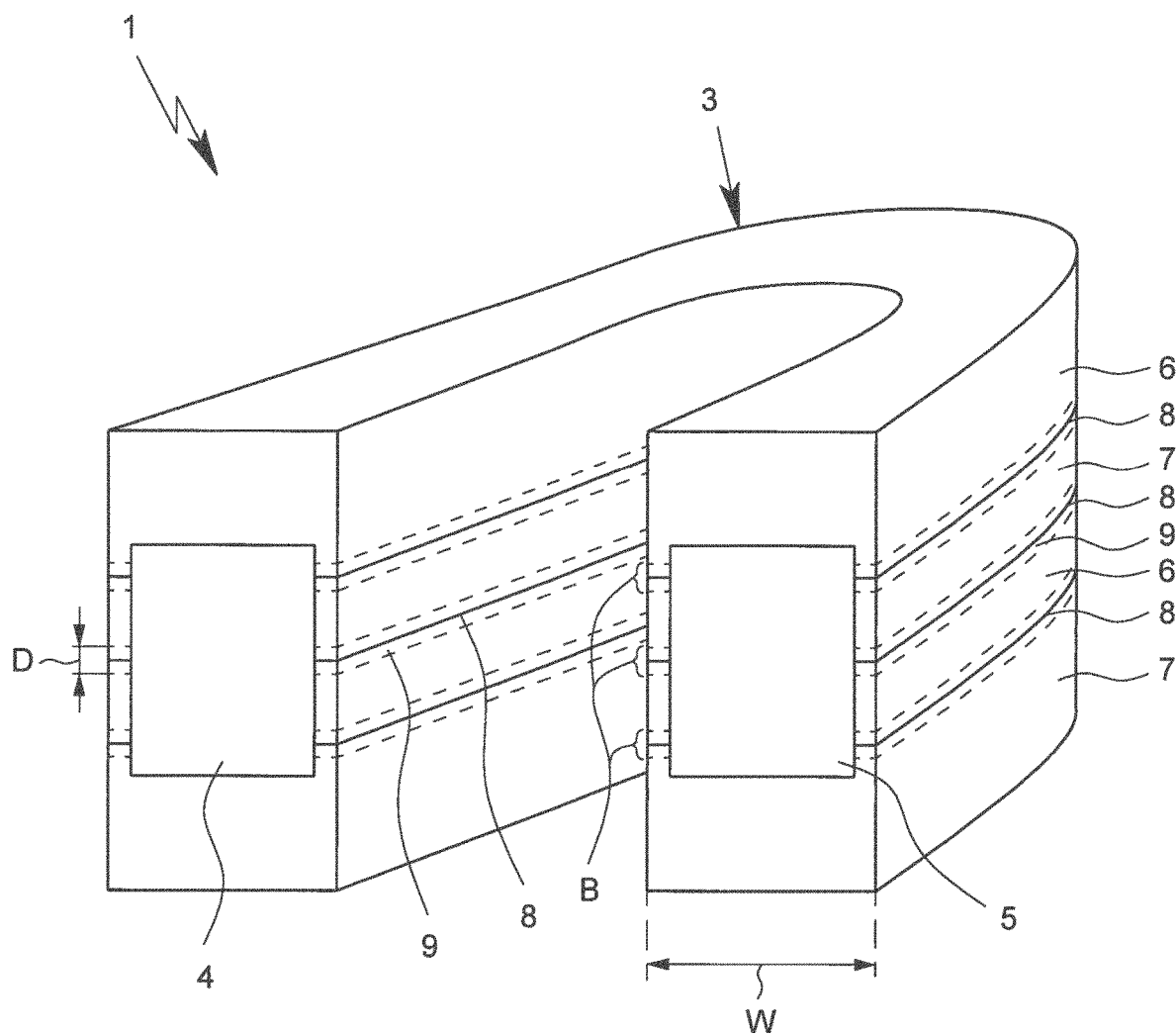
FIG. 10 shows a perspective view of a proposed device according to a fifth embodiment in a representation corresponding to FIG. 1.

In a schematic representation corresponding to FIG. 1, FIG. 10 shows a fifth embodiment of the proposed device 1 with several movement regions B or electron gases that are particularly layered with their flat sides on top of one another.

The several movement regions B are preferably formed in or by a common guide device 3.

The several movement regions B are preferably connected in parallel and/or connected via common electrodes 4, 5.

Different intermediate or depletion layers can be arranged or formed between the various movement regions B or electron gases as needed.

The foregoing remarks apply particularly in an analogous or supplementary manner to the fifth embodiment just as they do to the previous embodiments, for which reason repetitions in this regard will be omitted.

In general, it should be noted that, by means of the present invention, more precisely the device 1 according to the invention and the method according to the invention, an asymmetrical or direction-dependent conductivity can be or is generated and, accordingly, an electrical current. an electrical voltage, and/or an electrical power can be tapped or made available. In particular, a conversion of kinetic or thermal energy into electrical energy is made possible in a simple and efficient and/or direct manner.

As mentioned previously, individual aspects and features of the present invention and its various embodiments can be implemented individually and combined with one another as desired.

LIST OF REFERENCE SYMBOLS

1 device
2 carrier
3 guide device
4 connection
5 connection
6 layer/solid body
7 layer/solid body
8 boundary surface
9 flank
10 field-generating means
11 superconducting layer
12 leg
B movement region
E plane
F field
H main path
R radius of curvature
Z gyroradius of the carriers

The invention claimed is:

1. A device for guiding carriers, each of which has an electrical charge the device comprising:
a guide device for movably guiding the carriers in a movement region with a curved main path;
electrical connections arranged along the main path; and
a field-generating means for generating a field for guiding the carriers along the main path, such that power can be tapped at the electrical connection and the carriers have a different probability density at the electrical connections;
wherein the guide device includes a two-dimensional electron gas or a thin, superconducting layer for forming the movement region; and
wherein the guide device, the movement region and the main path extends at least substantially along a plane and are curved on the plane.

2. The device according to claim 1, wherein the guide device has two layers or solid bodies, lying particularly flat on top of one another, with different Fermi levels, with the movement region and/or the two-dimensional electron gas being formed on or along a boundary surface thereof.

3. The device according to claim 1, wherein the guide device has or forms several movement regions and/or or electron gases and/or superconducting layers lying flat on top of one another.

4. The device according to claim 1, wherein one or more flanks of the movement region for the carriers are embodied so as to be at least partially diffusely scattering and/or not exclusively specular.

5. The device according to claim 1, wherein a mean width of the movement region and a radius of curvature of the main path correspond at least substantially to or are less than a mean free path length of the carriers in the movement region.

6. The device according to claim 1, wherein the guide device and/or the movement region is singly or multiply angled and/or arcuate or semicircular at least in some areas.

7. The device according to claim 1, wherein a radius of curvature of the guide device and/or of the movement region is greater than 100 nm and less than 2000 nm.

8. The device according to claim 7, wherein the radius of curvature of the guide device and/or of the movement region is greater than 200 nm and less than 1600 nm.

9. The device according to claim 1, wherein a radius of curvature of the main path is greater than 100 nm and less than 2000 nm.

10. The device according to claim 9, wherein the radius of curvature of the main path is greater than 200 nm and less than 1600 nm.

11. The device according to claim 1, wherein the field-generating means is formed for generating a magnetic field.

12. The device according to claim 1, wherein the field-generating means or the field for guiding the carriers is adapted or can be set or controlled in consideration of a mean speed of the carriers such that the carriers are guided on trajectories with radii of curvature on the order of magnitude of a radius of curvature of the main path and/or movement region and/or guide device.

\* \* \* \* \*